United States Patent [19]
Konermann

[11] Patent Number: 5,552,262
[45] Date of Patent: Sep. 3, 1996

[54] PROCESS FOR PRODUCTION OF PHOTOPOLYMERIZABLE FLEXOGRAPHIC PRINTING PLATES

[75] Inventor: Herbert Konermann, Lengerich, Germany

[73] Assignee: E. I. Du Pont de Nemours and Company, Wilmington, Del.

[21] Appl. No.: 117,268

[22] Filed: Sep. 7, 1993

[30] Foreign Application Priority Data

Sep. 17, 1992 [DE] Germany .................. 42 31 102.0

[51] Int. Cl.⁶ .................. G03F 7/00; G03D 5/00; G03B 27/30; F26B 11/18
[52] U.S. Cl. .................. 430/306; 430/309; 430/328; 430/330; 134/15; 134/16; 134/17; 134/26; 134/30; 354/317; 354/318; 354/322; 354/324; 354/325; 354/326; 355/27; 355/100; 355/106; 34/381; 34/189; 34/190; 34/203
[58] Field of Search .................. 430/306, 309, 430/328, 330; 354/317, 318, 322, 326, 324, 325; 355/27, 100, 106; 34/60, 61, 189, 190, 380, 381; 134/15, 16, 17, 26, 30

[56] References Cited

U.S. PATENT DOCUMENTS

| | | | |
|---|---|---|---|
| 1,739,505 | 12/1929 | Cunningham | 34/189 |
| 3,635,711 | 1/1972 | Miller et al. | 430/309 |
| 3,911,593 | 10/1975 | Colapinto | 34/190 |
| 4,142,194 | 2/1979 | Hamlin | 354/318 |
| 4,209,917 | 7/1980 | Johnson | 34/189 |
| 4,259,002 | 3/1981 | Thawley et al. | 354/326 |
| 4,542,968 | 9/1985 | Knollmann | 354/322 |
| 4,902,608 | 2/1990 | Lamb et al. | 354/317 |

FOREIGN PATENT DOCUMENTS

| | | | |
|---|---|---|---|
| 0225678 | 6/1987 | European Pat. Off. . | |
| 2706913A1 | 8/1978 | Germany | G03D 13/00 |
| 3248411 | 7/1984 | Germany . | |

*Primary Examiner*—George F. Lesmes
*Assistant Examiner*—Bernard P. Codd
*Attorney, Agent, or Firm*—Thomas H. Magee

[57] ABSTRACT

High volume manufacturing process for flexographic printing plates comprises wash out, drying and post-exposure. During drying the printing plates are transported with a plurality of endless conveyors. The transport speed during drying/post-exposure is lower than the transport speed during wash out such that a storage of flexographic plates can be achieved in the drying and post exposure portion of the process.

16 Claims, 1 Drawing Sheet

PROCESS FOR PRODUCTION OF PHOTOPOLYMERIZABLE FLEXOGRAPHIC PRINTING PLATES

BACKGROUND OF THE INVENTION

1. Field of the Invention

The invention concerns a process for the production of photopolymerizable flexographic printing plates in which the exposed printing plates are washed out and dried with the image side up and if necessary given a secondary treatment.

2. Description of Related Art

Flexographic printing plates are elastic elevated printing forms with a relief-like surface. To produce this surface the printing plates are first exposed or otherwise treated, at which time, depending on the version, the exposed or unexposed parts polymerize out. The unpolymerized regions are then washed out, if necessary with the aid of brushes.

In a known process of this type (EP 0 225 678 B1) the printing plates with their exposed side down are kept in a continuous motion through a number of series-arranged rotating brushes which dip into a washing fluid. After passing the brushes the printing plates are inverted so that they come to lie with the image side up. Before or during the turn, the remaining fluid is removed by suction. The turned printing plates are then blown on by drying air from above, during which they are pulled past at the same speed as in the case of drying by blow nozzles. Following this drying air treatment the printing plates are turned again and conveyed in the vertical position up to a secondary treatment station where they are given another drying after being turned again so that image side is up once more.

The problem with machines of this type is that the drying usually lasts much longer than the washing out process. Now if the printing plates are conveyed at the same speed through the washing-out section and the drying section, the drying section must have a much greater length than the wash out section. As an alternative to this the washing time can be lengthened or the drying time shortened. Compromises of this type, however, lead to unsatisfactory results. It has also been found that in the known process there are limitations for the operating speed, because in the section in which the printing plates are hanging freely downward, at higher speeds accelerating forces act on the printing plates which lead to an undesired deformation of the printing plates. Since these deformations cannot be controlled, here especially in the case of multi-color printing where a printed image is produced with the aid of several printing plates, undesired changes in the final printed image appear.

DE 32 48 411 C2 shows a device for the multi-step treatment of photo printing plates in which the photo printing plates in a horizontal position are washed out from above with brushes. Then they are suspended on one edge and guided while hanging vertically through various stations where the printing plates are dried and subjected to other chemical treatments. Between the individual stations the hanging printing plate must always be raised and lowered. In this case also the hanging printing plate must absorb the accelerating forces in each case so that the magnitude of the lifting and lowering speeds is limited. The known device also operates with a fixed rhythm. This also limits the fabrication speed of the device.

The invention has the objective of devising a process which permits the production of printing plates at high speeds and with high quality.

SUMMARY OF THE INVENTION

This problem is solved by the process of the type mentioned initially by the fact that during the drying or secondary treatment the transportation speed of the printing plates is set lower than in the case of washing, and the packing density of the printing plates is increased, while the printing plates are supported continuously from their back side.

In this way the conveying speed of the printing plates during the washing is decoupled from the transportation speed during drying or secondary treatment without greatly increasing the space requirement for this mode of operation. By reducing the transportation speed of the printing plates during drying, although the printing plates tend to pile up in this section, the congestion is not considerable, because relatively more printing plates can be brought into the same volume, i.e., the packing density of the printing plates is increased. This can be carried out directly because only the transportation speed is changed but not the rate at which the printing plates are fed to the process and removed from it. By supporting the printing plates on their back side, the risk that the printing plates will be deformed undesirably by the forces acting during transportation is relatively small. By coupling these process steps a higher throughput of printing plates can be achieved without suffering a loss in quality of the printing plates.

If the printing plates with their image side down are washed and then turned, it is preferred for the orientation of the printing plates in space to remain essentially the same after the turn. The printing plates, in other words, remain with their image side up regardless of whether they are being conveyed to drying or from drying to secondary treatment. This permits a very gentle handling of the printing plates. Once the printing plates are lying with their image side up they must not be turned any more.

Advantageously the printing plates remain in intermediate storage during drying or secondary treatment. The printing plates are therefore temporarily no longer even moved in this segment. Such a movement is also not necessary for drying or secondary treatment as a rule. A movement is carried out only when it is necessary in order to fill or empty the storage container.

In this case it is advantageous that the storage is accomplished according to the first-in-first-out principle. The printing plates are then treated in the correct sequence. All printing plates can then be dried or subjected to secondary treatment in accordance with the desired conditions, therefore, e.g., for equal lengths of time.

The printing plates are preferably transported to drying or secondary treatment transversely to the direction of transportation for washing out and transversely to the normal vector to their main plane. The printing plates are therefore moved to drying or secondary treatment in their present plane but essentially transversely to the direction in which they are moved during washing out. In this way one achieves two advantages. On the one hand the drying and, if necessary, the secondary treatment, can be separated from the washing out process in space in such a way that sufficient space is available for manipulation of the printing plates. On the other hand, the printing plates with such a cross motion accept the forces acting on them with no problems whatever. The force of cross motion and force of gravity act in different directions so that deformation of the printing plates is essentially excluded.

At this time the transportation to drying or washing can optionally take place in one of two essentially opposite directions. The drying or secondary treatment capacity is doubled in this way. For example, the printing plates may be transported to drying or secondary treatment alternately in the one or the other direction. Since the drying or secondary treatment requires the most time, in this way the throughput can be increased quite considerably.

The printing plates are preferably arranged with their main planes parallel to one another during drying or secondary treatment. Since the printing plates have a relatively low height relative to their base area, a relatively high packing density can be achieved in this way, i.e., by three-dimensional arrangement of the printing plates, a relatively large number of printing plates can be brought into a relatively small base area.

This is especially advantageous when the printing plates are arranged one atop the other. Despite the intervening spaces remaining between the printing plates, high packing density can be achieved in this way. The process then gets by with a small space requirement.

Advantageously the printing plates during drying or secondary treatment are moved in the direction of the vector normal to their main plane. At one end of the stack then new printing plates can be fed in, while at the other end dried or secondarily-treated printing plates can be removed.

In this case it is preferred for the printing plates during drying and during secondary treatment to move in opposite directions. The printing plates are then conveyed in a bucket-chain manner. On the one hand this keeps the height of the space required within limits, and on the other hand it makes it possible to feed in and remove the plates for drying and for secondary treatment essentially at the same height. This facilitate operation quite considerably.

The process steps of washing out, drying and, if necessary, secondary treatment preferably take place in different environments. This decoupling from the environment improves the result.

The washing out preferably takes place at a pressure reduced compared to ambient pressure. In this way the vapors of the washing fluid are kept from penetrating into the environment and causing problems there. In particular, in this way no disturbances of the drying or secondary treatment can be caused by such vapor.

The secondary treatment advantageously includes exposure of the printing plates to light of a preassigned spectrum. For example, the printing plates can be cured in this way.

BRIEF DESCRIPTION OF THE DRAWINGS

The invention can be more fully understood from the following detailed description thereof in connection with accompanying drawings described as follows.

DESCRIPTION OF THE PREFERRED EMBODIMENT(S)

Figure 1:
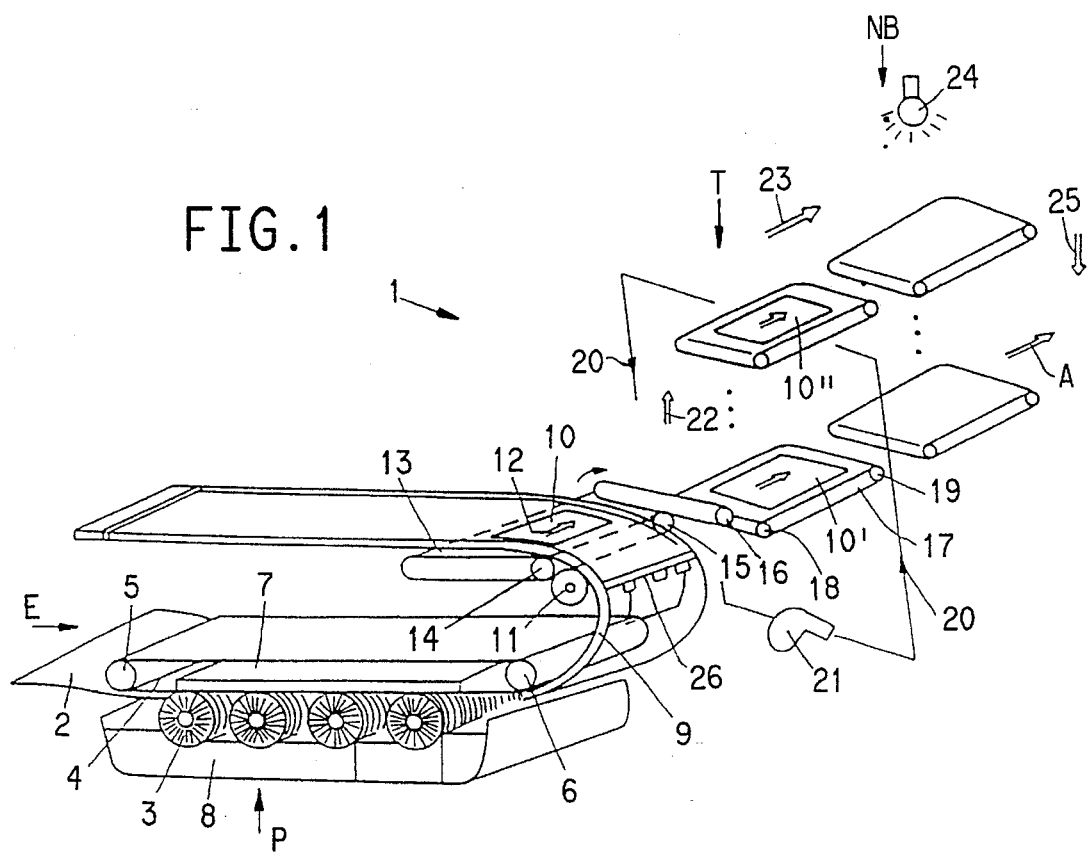
FIG. 1 is a schematic representation of an apparatus for implementation of the process of the present invention.

Throughout the following detailed description, similar reference characters refer to similar elements in all figures of the drawings.

FIG. 1 shows a device 1 with the aid of which photopolymerizable flexographic printing plates can be washed out, dried and secondarily treated. Such a printing plate 2 is introduced in the direction of the arrow E into a washing out segment P. The printing plate 2 at this time passes between rotating brush rolls 3 and a revolving belt 4 which is guided via two turning rolls, 5, 6 in the form of an endless loop. The belt 4 in turn is supported on an attachment 7 affixed to the housing. The brush rolls 3 dip into a basin 8 containing washing fluid and are wetted in so doing. They transport the washing fluid out of the basin 8 onto the printing plate 2. The washing fluid at this time dissolves the unpolymerized parts out of the printing plate 2. The latter are then mechanically removed with the aid of the brush rolls 3. If necessary several basins 8 can be arranged in series as a cascade, as is known from EP 0 225 678 B1. During the washing out process the printing plates 2 lie with their image side down. Their back side is supported on the attachment 7 via the revolving belt 4. The printing plates 2 are pulled by pull rods between the brush rolls 3 and the belt 4. A pull rod 26 is shown in FIG. 1. After the wash out segment P the pull rods are guided into a turner 9 in such a way the printing plates are turned. After the turner 9 they lie with the image side up, as is shown, e.g., by a printing plate 10 which contains an arrow 12 as the image. The turning is supported by a turning roll 11.

After the turn, i.e., when the printing plate 10 is lying with its image side up, the direction of motion of the printing plate 10 is changed, i.e., it is now transported in the direction of the arrow 12 out of washing segment P into drying segment T. The motion in this case is transverse to the original direction of transportation. The orientation of the printing plate 10 in space, however, remains essentially the same, i.e., its image side faces up as before. During the entire movement, it is continuously supported. The support appears at the beginning of this transverse motion by a first conveyor belt 13 which is guided and powered by two turning rolls 14, 15. Then the printing plate 10 runs through an intermediate roll 16 with the aid of which small differences in height between the position of the printing plate 10 in the wash out segment P and in the target position in the drying segment T can be equalized. In the drying segment T the printing plate, here denoted by 10', is guided to another conveyor belt 17 which goes around and is powered by two turning rolls 18, 19. As soon as the printing plate 10' has reached its position on the conveyor belt 17 in the drying segment T, the conveyor belt 17 is stopped. The printing plate 10' is now exposed to the cross air stream shown schematically by arrows 20 which is generated by a blower 21. The movements of the printing plate 10' are limited inside the drying segment T to a movement perpendicular to planes containing back sides of the printing plates, i.e., to a movement in the direction of arrow 22. Such a movement, to be sure, cannot be permanent. It is only necessary when the place on which the printing plate 10' is located must be surrendered for the next following printing plate. In this case the conveyor belt 17 with the turning rolls 18, 19 is raised and an empty conveyor belt is made ready. The printing plate 10' in this way passes from the lower initial position shown, gradually, into an upper end position in which the printing plate 10" is located, the situation shown in FIG. 1. Several printing plates are therefore stacked one above the other and parallel to one another. The already dried printing plates 10" are removed from the top of the stack. Freshly washed out printing plates 10' are inserted at the bottom of the stack. The drying segment T is therefore designed as a storage container which operates according to the first-in-first-out principle, i.e., the printing plates are removed from the storage space in the sequence in which they were introduced into it.

The conveyor belt 17 on which the printing plate 10' is seated moves together with the printing plate 10' through the entire drying segment T. The conveyor belt 17 is also the underlayer on which the printing plate is conveyed in secondary treatment segment NB. For this purpose, the entire conveyor belt 17 is transported in the direction of the arrow 23 into the secondary treatment segment NB. The printing plates 10', 10" are therefore continuously supported from their back side, i.e., from the side facing away from the image side.

In the secondary treatment segment NB, a light bulb 24 is positioned which produces light of a preassigned wavelength. Preferably, UV light is involved. For instance, with UV-C, i.e., in the range of about 250 nm, any residual tackiness present on the printing plates can be removed and in the case of UV-A, i.e., at about 370 nm a complete polymerization of the material of the printing plate can take place.

In the secondary treatment step NB, the conveyor belts 17 are again moved downward, i.e., in the direction of the arrow 25. The conveyor belt 17 therefore moves in the manner of a bucket-chain upward into the drying segment T and downward into the secondary treatment segment NB. In this way, an empty conveyor belt 17 is automatically introduced into the drying segment T when a conveyor belt 17 switches to the secondary treatment segment NB at the other end of the stack.

The speeds of conveying of the printing plates, 2, 10, 10', 10" in the wash out segment P and in the drying segment T are totally decoupled from one another. The movement of each printing plate in the drying segment T is perpendicular to its plane, while in the wash out segment P it essentially moves in its plane.

The secondary treatment segment NB is shown in such a way that the exposure which the secondary treatment includes here takes place only in the topmost position of the conveyor belt 17. As soon as the secondarily-treated printing plate has been lowered in order to make room in the secondary treatment segment NB for the next printing plate, the secondary treatment is ended. The printing plates can therefore be removed in the secondary treatment segment practically at any height without waiting for them to go back to the lowest level. However, it may also be provided that such an exposure takes place in all levels. At any rate, the printing plates are removed in the direction of the arrow A.

Figure 2:
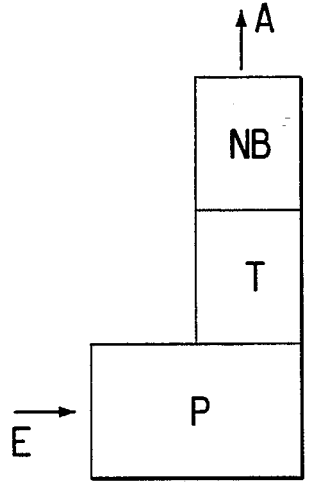
FIG. 2 is a schematic representation of a top view of FIG. 1.

FIG. 2 shows schematically a top view of the device 1. One recognizes here that the drying segment T and the secondary treatment segment NB are arranged in series but transversely to the wash out segment P. In FIG. 2, the printing plate must be removed from the wash out segment after turning to the right.

Figure 3:
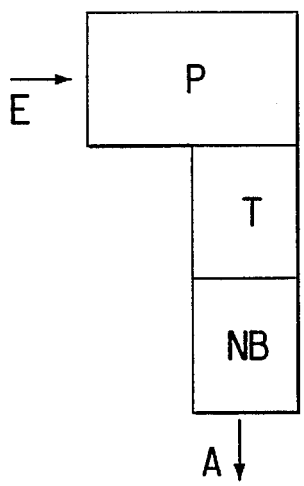
FIG. 3 is a top view of a first alternative.

FIG. 3 shows another alternative in which the printing plate must be removed to the left.

Figure 4:
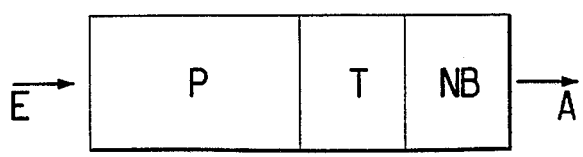
FIG. 4 is a top view of a second alternative.

FIG. 4 shows an alternative in which the printing plates continue to move straight ahead.

Figure 5:
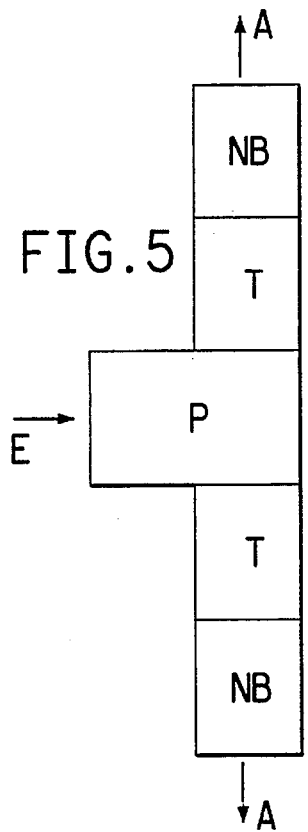
FIG. 5 is a top view of a third alternative of the apparatus.

FIG. 5 shows an alternative in which a drying segment T and a secondary treatment segment NB are arranged on both sides of the wash out segment P. In this case the printing plate can optionally be conveyed in one of two opposite directions when it has left the wash out segment behind. In this case, the capacity of the device can be further increased. For example, the printing plate can alternatively be transported into the one or into the other drying segment T.

In summary, the invention is a process for production of photopolymerizable flexographic printing plates (2) in which the exposed printing plates are washed out and dried with their image side (12) up and given secondary treatment if necessary.

In such a process a high quality can be assured with a high throughput.

For this purpose during the drying or secondary treatment the speed of transportation of the printing plates (2) is set lower than that of washing out and the packing density of the printing plates is increased, the printing plates being continuously supported on their back side.

Those skilled in the art, having the benefit of the teachings of the present invention as hereinabove set forth, can effect numerous modifications thereto. These modifications are to be construed as being encompassed within the scope of the present invention as set forth in the appended claims.

What is claimed is:

1. A process for production of photopolymerizable flexographic printing plates in which exposed printing plates are washed out with image sides down at a conveying speed and dried with the image sides up at a transportation speed characterized by the fact that the plates with the image sides up are transferred onto a plurality of conveyor belts in a dryer where the plates are dried, each conveyor belt receiving only one plate at a time; and that during drying the printing plates are transported in a direction perpendicular to planes containing back sides of the printing plates, the transportation speed is selected to be lower than the conveying speed, packing density of the printing plates is increased during the drying, and the printing plates are continuously supported from the back sides.

2. The process as in claim 1, in which after the printing plates with their image sides down are washed, the plates are turned about a turner to lie with the image sides up, such that the orientation of the printing plates in space remains essentially horizontal after the turn.

3. The process as in claim 1, characterized by the fact that the printing plates are subjected to intermediate storage during the drying.

4. The process as in claim 3, characterized by the fact that the storage is according to a first-in-first-out principle.

5. The process as in claim 1, characterized by the fact that the printing plates are transported to the dryer transversely to the direction of transportation during washing out and transversely to a normal vector to the planes containing the back sides of the printing plates.

6. The process as in claim 5, characterized by the fact that transportation to drying or washing out is optionally in one of two essentially opposite directions.

7. The process as in claim 1, characterized by the fact that the printing plates during the drying are arranged with the planes containing the back sides parallel to one another.

8. The process as in claim 7, characterized by the fact that during the drying the printing plates are arranged one above the other.

9. The process as in claim 7, characterized by the fact that after the drying the printing plates undergo secondary treatment while being moved in a direction of a normal vector to the planes containing the back sides.

10. The process as in claim 9, characterized by the fact that the printing plates during the secondary treatment are moved in a direction that is opposite to the direction that the plates are moved during the drying.

11. The process as in claim 9, characterized by the fact that the process steps of washing out, drying and secondary treatment take place in separate environments.

12. The process as in claim 9, characterized by the fact that the secondary treatment includes exposure of the printing plates to light of a preassigned spectrum.

13. The process as in claim 1, characterized by the fact that the washing out is performed at reduced pressure relative to ambient pressure.

14. A process for production of photopolymerizable flexographic printing plates having image sides and back sides, comprising:

(a) conveying the plates in a generally horizontal first direction at a first speed with the image sides facing down;

(b) washing the image sides during step (a);

(c) conveying the plates about a turner until the plates are being conveyed in a generally horizontal second direction, opposite to the first direction, with image sides face up;

(d) transferring the plates with the image sides up onto a plurality of conveyor belts, each conveyor belt receiving only one plate at a time;

(e) transporting the plates on the conveyor belts in a direction of a vector normal to planes containing back sides of the plates while the image sides face up at a second speed that is slower than the first speed; and (f) drying the plates during step (e).

15. The process of claim 14, further comprising:

after step (f), removing the plates from the conveyor belts.

16. The process of claim 14, further comprising:

(g) transporting the plates on the conveyor belts to a secondary treatment segment wherein the plates are exposed to light while being transported in a direction opposite to the direction that the plates are transported during drying;

(h) removing the plates from the conveyor belts;

(i) after removing the plates, transporting the conveyor belts to a position to receive one of the plates from the transferring step; and (j) repeating steps (e) through (i).

* * * * *